(12) United States Patent
Schneider et al.

(10) Patent No.: US 8,508,224 B2
(45) Date of Patent: Aug. 13, 2013

(54) METHOD FOR OBTAINING AMPLITUDE AND PHASE DEPENDENCIES OF RF PULSES FOR SPATIALLY SELECTIVE EXCITATION

(75) Inventors: Johannes Schneider, Karlsruhe (DE); Peter Ullmann, Karlsruhe (DE)

(73) Assignee: Bruker BioSpin MRI GmbH, Ettlingen (DE)

( * ) Notice: Subject to any disclaimer, the term of this patent is extended or adjusted under 35 U.S.C. 154(b) by 512 days.

(21) Appl. No.: 12/659,926

(22) Filed: Mar. 25, 2010

(65) Prior Publication Data
US 2010/0253336 A1  Oct. 7, 2010

(30) Foreign Application Priority Data
Apr. 1, 2009  (DE) .......................... 10 2009 002 112

(51) Int. Cl.
*G01V 3/00*  (2006.01)
(52) U.S. Cl.
USPC .......................................................... 324/309
(58) Field of Classification Search
USPC ................................................. 324/300–322
See application file for complete search history.

(56) References Cited

U.S. PATENT DOCUMENTS

| 4,988,947 A | 1/1991 | Ugurbil |  |
|---|---|---|---|
| 6,680,610 B1 * | 1/2004 | Kyriakos et al. | 324/307 |
| 2007/0090838 A1 * | 4/2007 | Hennig | 324/307 |
| 2010/0066362 A1 * | 3/2010 | Ullmann | 324/309 |

FOREIGN PATENT DOCUMENTS

| DE | 101 12 625 | 11/2002 |
| DE | 10 2005 051 021 | 4/2007 |
| EP | 1 052 521 | 11/2000 |
| WO | WO 2008/071155 A1 * | 6/2008 |
| WO | WO 2009/036936 | 3/2009 |

OTHER PUBLICATIONS

N. Boulant, J.-F. Mangin and A. Amadon "Counteracting Radio Frequency Inhomogeneity in the Human Brain at 7 Tesla Using Strongly Modulating Pulses", Magnetic Resonance in Medicine 61:1165-1172 (2009).

(Continued)

*Primary Examiner* — Melissa Koval
*Assistant Examiner* — Daniel Miller
(74) *Attorney, Agent, or Firm* — Paul Vincent

(57) ABSTRACT

A method for obtaining amplitude and phase dependencies of radio frequency pulses, which are irradiated within the scope of a main magnetic resonance experiment for generating a predetermined n-dimensional spatial distribution (n>=1) of transverse magnetization in an object by means of at least one radio frequency transmitting antenna of a magnetic resonance measuring system in combination with spatially and temporally varying additional magnetic fields which are superimposed on the static and homogeneous base field of the magnetic resonance measuring system and change the transverse magnetization phase in the object in dependence on location and time is characterized in that, prior to performance of the main experiment, a preparational measurement is performed in which the change with time of the transverse magnetization phase in the object under the action of the additional magnetic fields is measured in a position-resolved fashion and the amplitude and phase dependencies of the radio frequency pulses for the main experiment are calculated on the basis of this change with time of the transverse magnetization phase, which is measured in a position-resolved fashion. In this fashion, experimental imperfections in the form of unintentional additional magnetic fields can be measured, taken into consideration and compensated for.

21 Claims, 8 Drawing Sheets

(56) References Cited

OTHER PUBLICATIONS

Kawin Setsompop "High-flip-angle slice-selective parallel RF transmission with 8 channels at 7T", Journal of Magnetic Resonance 195 (2008) 76-84.

Pauly, J.; Nishimura, D.; Macovski A.: "A k-space analysis of small-tip-angle excitation". Journal of Magnetic Resonance 81 (1989), p. 43-56.

Katscher U.; Boernert, P.; Leussler, C.; Van Der Brink, J. S.: "Transmit Sense". Magnetic Resonance in Medicine 49 (2003), p. 144-150.

Meyer, C. H.; Pauly, J. M.; Macovski, A.; Nishimura, D. G.: "Simultaneous spatial and spectral selective excitation". Magnetic Resonance in Medicine 15 (1990), p. 287-304.

Setsompop, K.; Alagappan, V.; Gagoski, B.; Wald, L.; Adalsteinsson, E.: "Uniform Wideband Slab Selection with B1+ Mitigation at 7T via Parallel Spectral-Spatial Excitation". Proceedings 16th Scientific Meeting, International Society for Magnetic Resonance in Medicine (2008), 616.

Schomberg, H.; Boernert, P.: "Off-resonance correction of nD spatially selective RF pulses". Proceedings 6th Scientific Meeting, International Society for Magnetic Resonance in Medicine, Sydney, 1998, p. 2059.

Boernert, P.; Aldefeld, B.: "On spatially selective RF excitation and its analogy with spiral MR image acquisition". Magnetic Resonance Materials in Physics, Biology and Medicine 7 (1998), p. 166-178.

Yip, C.-Y.; Fessler, J. A.; Noll, D. C.: "Iterative RF pulse design for multidimensional, small-tip-angle selective excitation". Magnetic Resonance in Medicine 54 (2005), p. 908-917.

Grissom, W.; Yip, C.-Y.; Zhang, Z.; Stenger, V. A.; Fessler, J. A.; Noll, D. C.: "Spatial domain method for the design of RF pulses in multicoil parallel excitation". Magnetic Resonance in Medicine 56 (2006), p. 620-629.

Ullmann, P.; Haas, M.; Hennel, F.; Wick, M.; Voiron, J.; Zaitsev, M.; Hennig, J.; Ruhm, W.: "Parallel Excitation Experiments Using Measured k-Space Trajectories for Pulse Calculation". Proceedings 16th Scientific Meeting, International Society for Magnetic Resonance in Medicine (2008), 1313.

Duyn, J. H. ; Yang, Y.; Frank, J. A.; Van Der Veen, J. W.: "Simple correction method for k-space trajectory deviations in MRI". Journal of Magnetic Resonance 132 (1998), p. 150-153.

Papadakis, N. G.; Wilkinson, A. A.; Carpenter T. A.; Hall, L. D.: A general method for measurement of the time integral of variant magnetic field gradients: application to 2D spiral imaging. Magnetic Resonance Imaging 15 (1997), p. 567-578.

Papadakis N. G. et al. "A general method for measurement of the time integral of variant magnetic field gradients: application to 2D spiral imaging", Magnetic Resonance Imaging, Elsevier Science, Tarrytown, NY, US LNKD-DOI:10.1016/S0730-725X(97)00014-3, vol. 15, Nr. 5, Jan. 1, 1997.

Ullmann, P. et al., Parallel excitation experiments using measured k-space trajectories for pulse calculation, Proceedings of the International Society for Magnetic Resonance in Medicine, 16th Scientific Meeting and Exhibition, Toronto, Canada, May 3-9, 2008, Apr. 19, 2008, Pa. 1313.

Zhang, Y. et al., "A novel K-Space Trajectory measurement Technique", Magnetic Resonance in Medicine, Academic Press, Duluth; MN, US, vol. 39, Jun. 1, 1998, Pa. 999-1004.

Grissom, W. et al., "Spatial domain method for the design of RF pulses in multicoil parallel excitation", Magnetic Resonance in Medicine, Academic Press, Duluth; MN, US, LNKD-DOI:10.1002/MRM.20978, vol. 56, Nr.3, Sep. 1, 2006, Pa. 620-629.

Oelhafen, M. et. al., "Calibration of echo-planar 2D-selective RF excitation pulses", Magnetic resonance in Medicine, Academic Press, Duluth, MN, US, vol. 52, 2004, Pa. 1136-1145.

Takahashi A, Peters T., "Compensation of multi-dimensional selective excitation pulses using measured k-space trajectories", Magnetic Resonance in Medicine, Academic Press, Duluth, MN, US, vol. 34, 1995, Pa. 446-456.

Haas, M. et al., "T2*-compensated Transmit Sense RF pulses", Intl. Soc. Mag. Reson. Med. 17 (2009).

Dan Xu, et al., "A Noniterative Method to Design Large-Tip-Angle Multidimensional Spatially-Selective Radio Frequency Pulses for Parallel Transmission", Magnetic Resonance in Medicine 58:326-334 (2007).

\* cited by examiner

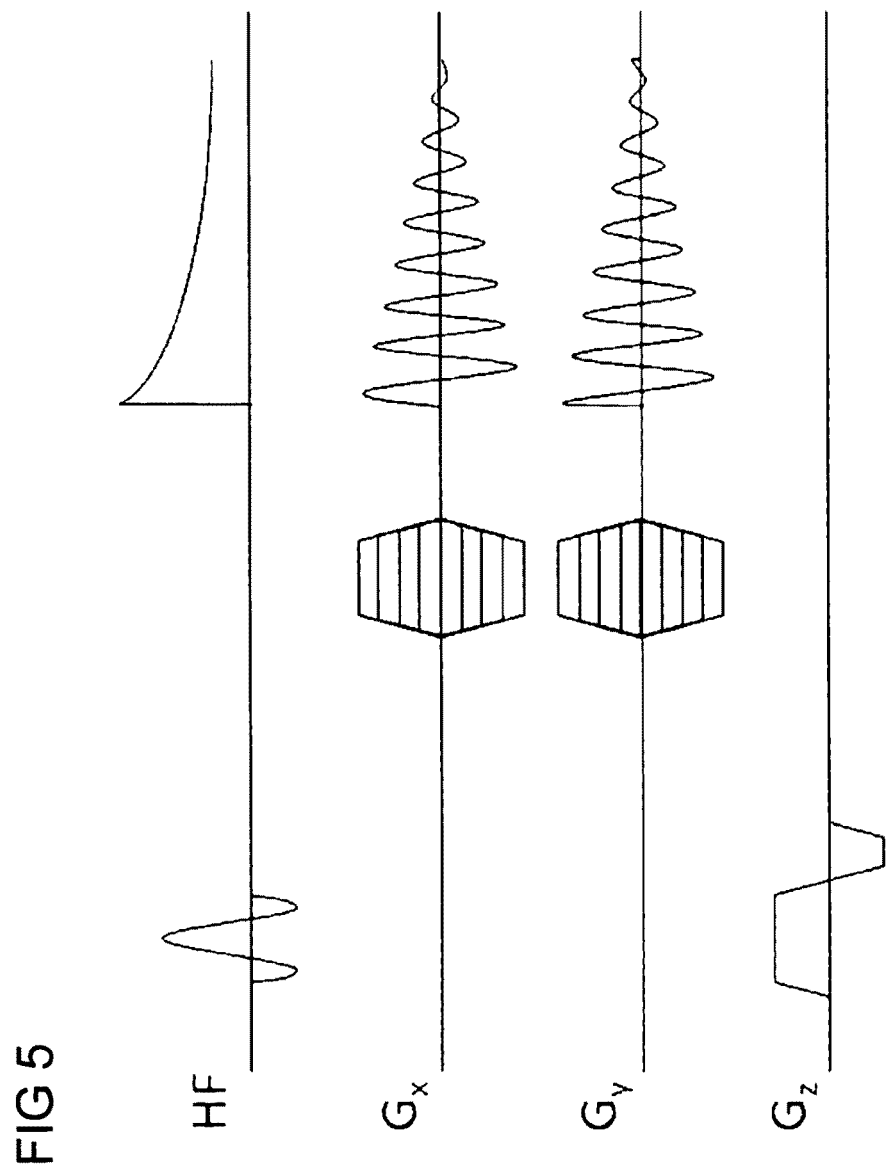

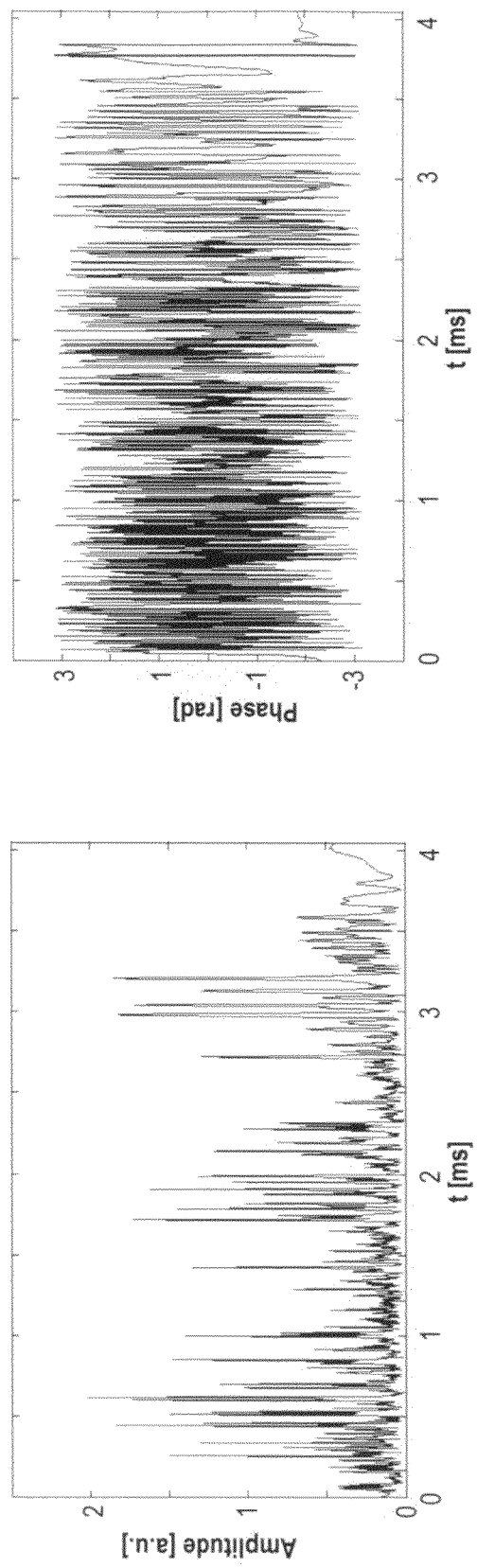

METHOD FOR OBTAINING AMPLITUDE AND PHASE DEPENDENCIES OF RF PULSES FOR SPATIALLY SELECTIVE EXCITATION

This application claims Paris Convention priority of DE 10 2009 002 112.4 filed Apr. 1, 2009 the complete disclosure of which is hereby incorporated by reference.

BACKGROUND OF THE INVENTION

The invention concerns a method for obtaining amplitude and phase dependencies of radio frequency pulses which are irradiated within the scope of a main magnetic resonance experiment for generating a predetermined n-dimensional spatial distribution (n>=1) of transverse magnetization in an object by means of at least one radio frequency transmitting antenna of a magnetic resonance measuring system in combination with spatially and temporally varying additional magnetic fields which are superimposed on the static and homogeneous base field of the magnetic resonance measuring system and change the transverse magnetization phase in the object in dependence on location and time.

A method of this type is disclosed e.g. in [9].

Magnetic resonance imaging (MRI), also called magnetic resonance tomography (MRT), is a widely used technology for non-invasive generation of images of the inside of an object under investigation and is based on the position-resolved measurement of magnetic resonance signals from the object under investigation. The object under investigation is subjected to a substantially static and homogeneous magnetic base field within a base field magnet, and for this reason, the nuclear spins within the object under investigation are oriented with respect to the direction of the base field, which is generally selected to be the z direction of a magnet-bound coordinate system. The associated orientation of the magnetic dipoles of the nuclei causes magnetization of the object in the direction of the main magnetic field, which is called longitudinal magnetization. In the MR investigation (MR: magnetic resonance), this longitudinal magnetization of the object under investigation is excited to perform a precession motion by irradiating electromagnetic RF pulses (RF: radio frequency) by means of one or more RF transmitting antennas, the frequency of the precession motion being proportional to the local magnetic field strength. The magnetization vector is thereby deflected out of the equilibrium state (z direction) through an angle, referred to below as the deflection angle. In the MRI methods that are generally used today, localized encoding, generally called spatial encoding, is impressed on the precession motions of the nuclear spins through time-varying superpositions of additional magnetic fields for all three spatial directions. The so-called gradient fields $G_x$, $G_y$ and $G_z$ which are used for this purpose and normally have constant gradients in the spatial directions x, y, and z, are generated by a coil arrangement, which is called a gradient system and is driven by a so-called gradient channel for each spatial direction. The terms linear and non-linear gradient or magnetic fields used below always refer to the spatial dependence of the fields unless another definition is given. The spatial encoding is normally described by a scheme in so-called k-space, which is conjugated from physical space via a Fourier transformation. Switching of gradient pulses in this k-space formalism, which can only be applied when magnetic fields with spatially constant gradients are used, can be described as passage through a trajectory in k-space, the so-called k-space trajectory.

The transverse component of the precessing magnetization connected with the nuclear spins, also called transverse magnetization below, induces voltage signals, also called magnetic resonance signals (MR signals), in one or more RF receiving antennas that surround the object under investigation. Time-varying magnetic resonance signals are generated by means of pulse sequences which contain specially selected series of RF pulses and gradient pulses (short-term application of temporally constant or varying gradient fields) in such a fashion that they can be converted into corresponding spatial images. This is realized in accordance with one of many well-known reconstruction technologies when the MR signals have been recorded, amplified, and digitized by means of an electronic receiving system, and processed by means of an electronic computer system, and also stored in one-dimensional or multi-dimensional datasets. The pulse sequence that is used typically contains a sequence of measuring processes in which the gradient pulses are varied in accordance with the selected localization method.

One essential precondition for spatially accurate imaging of the nuclear spins of the object under investigation is that the technical imperfections of the MR measuring system can be neglected or the deviations from ideal behavior are known and can be correspondingly corrected.

Spatially selective excitation is a technology that is widely used in magnetic resonance imaging for spatially delimiting the transverse magnetization that is generated during excitation and/or spatially varying its amplitude and phase in the excitation volume in accordance with predetermined distributions. For slice selection, which is the most frequent case of spatial selective excitation, the excitation volume is reduced to a predetermined slice. Multi-dimensional spatially selective excitation, in which the excitation volume is delimited in more than one direction and/or the excitation is modulated in more than one direction, has also produced numerous applications. These include excitation of a small three-dimensional volume within a substantially larger object under investigation for localized spectroscopy, imaging of a selectively excited region (ROI: region of interest) with reduced field of view (FOV) with the aim of reducing the measuring time or improving the resolution, excitation of special volumes that are adjusted to the structures of the object under investigation or also echo-planar imaging with reduced echo train lengths. The amplitude and phase modulation of transverse magnetization can also be used during excitation to compensate for disadvantageous effects of an inhomogeneous magnetic transmission field ($B_1$ field) of the RF antennas used for excitation. This is an application that has become immensely important these days due to the strong increase in high field MRI systems which often involve inhomogeneities of this type.

Spatially selective excitation was conventionally performed by means of one single RF transmitting antenna with a substantially homogeneous transmission field ($B_1$ field) in combination with the gradient system. Inspired by the success of parallel imaging, in which the signals are recorded with an arrangement of several RF receiving antennas, which is also called an antenna array in technical literature and which consists of several individual antennas or elements, one has started in the meantime to also use such antenna arrays, which consist of several elements and are operated on several RF transmission channels of the MR measuring system, for transmission with selective excitation. It is thereby possible to partially replace spatial encoding, which is realized for selective excitation analogously to acquisition by variation of gradient fields, by so-called sensitivity encoding and thereby reduce the length of the excitation pulses. One thereby utilizes the information which is contained in the different spatial variations of the transmission fields of the individual array elements (also called transmission profiles below). Since the length of such selective excitation pulses was in most cases one of the limiting criteria for the applicability of this technology, the so-called parallel excitation (PEX) or multi-channel excitation is a promising approach to use spatially selective excitation on an even wider basis than before. Spatial encoding during the transmission of RF pulses for selective excitation is called transmission spatial encoding below in order to distinguish it from spatial encoding during acquisition.

One of the basic tasks in connection with the use of selective excitation is the determination of the RF pulses that must be irradiated by the RF transmission system of the MR measuring system in order to generate the desired distribution of transverse magnetization in combination with additional magnetic fields. In the article "A k-space analysis of small tip-angle excitation" [1] Pauly et al. describe a method for single-channel spatially selective excitation by means of which the searched pulse form $B_1(t)$ can be calculated on the basis of a mathematical analogy between selective excitation and Fourier imaging substantially by Fourier transformation of the desired transverse magnetization distribution and scanning of the Fourier transform along a predetermined k-space trajectory. Katscher et al. extended this calculation method for the case of an antenna array having several independent transmission channels [2].

An object often contains several nuclear spin species having different precession frequencies, as is the case for nuclei of different chemical elements or similar nuclei in different chemical environments. The nuclear spin species can be combined into nuclear spin ensembles of the same Larmor frequency which each contribute to the overall transverse magnetization. Since the RF pulses determined according to Pauly et al. or Katscher et al. are, in general, optimum with respect to the realization accuracy of the desired transverse magnetisation distribution only for nuclear spins that precess at a determined frequency, these RF pulses excite different, generally unintentional distributions for transverse magnetization contributions of the individual nuclear spin ensembles. For this reason, Meyer et al. [3] or Setsompop [4] present e.g. methods that also allow spatially selective excitation for nuclear spin ensembles with a selected precession frequency. This case is called spatially spectrally selective excitation using spatially spectrally selective RF pulses. This approach also allows to predetermine individual distributions, which may be different or identical, for the transverse magnetization contributions of the individual nuclear spin ensembles, and excite them with one or several RF pulses. The terms spatially selective excitation or selective excitation are also used below unless the spectral selectivity is to be particularly emphasized.

The basis for the calculation methods of the RF pulses used for selective excitation are, in general, the well-known Bloch equations for describing the development of the magnetization in an object under the influence of external magnetic fields. Restricting to the case in which external fields deflect the sample magnetization out of the equilibrium state (z direction) through small angles only (called the small tip angle approximation below), the distribution of the transverse magnetization in the x-y plane, described as a complex variable, can be calculated according to the following equation (thereby neglecting relaxation effects):

$$M_{xy}(x) = i\gamma M_0 \sum_n^N S_n(x) \int_0^T B_{1,n}(t)e^{i\varphi(x,t)}dt \quad (1)$$

$M_{xy}$ is the generated transverse magnetization distribution, x designates the spatial coordinate, $\gamma$ defines the gyromagnetic ratio of the investigated spin species, $M_0$ is the equilibrium magnetization (the magnetic base field is oriented in the z direction), $B_{1,n}$ is the RF pulse supplied to the transmitting antenna n by N, $S_n$ is the spatial variation of the transmission field of array element n, $\phi$ is the phase that accumulates in the transverse magnetization from the time of generation to termination of the influence of the additional magnetic fields, and T is the duration of the longest one of the N RF pulses. $M_{xy}$ and $B_{1,n}$ are complex variables, the real and imaginary parts of which describe the x or y components of the respective vector size in the coordinate system that rotates with the RF pulses (vectorial variables are in bold print).

In addition to the target pattern $M_{xy}$ to be excited, a k-space trajectory $k^{nom}(t)$, which determines, in the k-space formalism with $\phi(x,t)=xk(t)$, the time- and spatially dependent development of the phase of transverse magnetization, abbreviated below as (spatial) phase development, is predetermined and inserted in equation (1) in the calculation methods of Pauly et al. and Katscher et al. The spatial phase development thereby describes the change of the transverse magnetization phase due to the gradient fields used for k-space trajectory generation. The solution of the inverse problem with respect to equation (1) thereby provides the desired RF pulses $B_{1,n}(t)$, which generate the desired distribution of transverse magnetization in case of application during exact passage of the predetermined k-space trajectory.

RF pulses calculated in this fashion generally yield a high realization accuracy of the desired transverse magnetization distribution only for small deflection angles of magnetization in the validity range of the small tip angle approximation, for which reason, they are also called small-tip-angle pulses. When the small tip angle approximation is not used and RF pulses for large deflection angles (large-tip-angle pulses) are calculated, the Bloch equations produce a non-linear system of equations, for which no analytical solutions are currently known. In order to determine RF pulses, which are suited e.g. as inversion pulses or refocusing pulses, other approximations or iterative solutions of the system of equations must therefore be used, as proposed e.g. by Xu et al. [7]. This example is based e.g. on a linear connection between the transmission field ($B_1$) and the excitation angle achieved thereby. In correspondence with small tip angle approximation, in the present case and in most calculation methods, a phase development $\phi(x,t)$ of transverse magnetization is included in the calculation of the RF pulses. This phase development is defined in this case, in particular, by a k-space trajectory with $\phi(x,t)=xk(t)$.

Since all calculations of the RF pulses in the above-presented methods are based on a k-space trajectory, the theoretical values in the calculation step and the actual values in the experiment must essentially coincide to obtain a high realization accuracy of the desired transverse magnetization distribution: Modern MR devices can generally apply RF pulses with high accuracy with respect to amplitude and phase. The k-space trajectory can, however, considerably differ from its nominally assumed dependence, as shown below, whereby the realization accuracy of the transverse magnetization distribution can be considerably reduced in dependence on the magnitude of the deviations and the selection of the k-space trajectory. Artifacts can thereby occur.

Passage through the k-space trajectory is generally realized by application of gradient pulses with additional magnetic fields that are linear in space and superimposed on the base field of the magnetic resonance measuring system. In addition to these intentional additional magnetic fields, unintentional additional magnetic fields are also present in the experiment, which need not be spatially linear or constant in time. All deviations from the intentional fields can be combined as unintentional additional magnetic fields of this type. These are i.a. inhomogeneities and variations with time of the magnetic base field which is assumed to be homogeneous and static, which ensure that the resonance frequency of the nuclear spins at certain locations of the object under investigation or at certain times no longer corresponds to the irradiated RF frequency, i.e. off-resonances occur. Amplitude deviations and time delays of actually applied gradient pulses compared to their nominally predetermined values due to technical imperfections of the gradient system and due to physical technical interferences, such as e.g. induced eddy currents and couplings in and between the components of the magnetic resonance measuring system, also occur. The term intentional or unintentional additional magnetic fields used below also includes those cases in which the field strength of these additional fields is zero.

The development with time of the transverse magnetization phase (phase development $\phi(x,t)$) is thereby no longer solely determined in the experiment by a predetermined nominal k-space trajectory or the intentional additional magnetic fields used for the generation thereof, but also by the mentioned unintentional magnetic fields.

In consequence of these interferences, further approaches for pulse calculation of spatially selective excitation were gradually devised. Some work [5, 6] uses the so-called "conjugate-phase" (CP) approach from image reconstruction, which takes into consideration at least effects of off-resonances that must be determined in most cases in a previous experiment, as a component of unintentional additional magnetic fields and correct them to a certain degree. These approaches for pulse calculation are nevertheless not optimum in several ways. The algorithms generally produce pulses that are suboptimal with respect to the realization accuracy of the desired transverse magnetization distribution, in particular, when undersampling takes place in the k-space trajectory or when the off-resonance influences vary greatly spatially. A more recent method for pulse calculation that was introduced by Yip et al. [8] and was generalized by Grissom et al. [9] for the multi-channel transmission case, is based on an optimization approach and improves the excitation accuracy in two ways. On the one hand, it is more robust with respect to undersampling in k-space. Moreover, consideration of off-resonance influences in pulse calculation is facilitated. It also offers the possibility of including further boundary conditions, such as the control of the integrated or also maximum RF transmitting power, into the calculation, which is important in view of SAR control (SAR: Specific Absorption Rate) or in view of technical limitations of the RF power transmitters. However, deviations of the k-space trajectory that is actually generated by the gradient system from the theoretically predetermined trajectory cannot be taken into consideration with these methods.

One approach for solving the last-mentioned problem is (see Ullmann et al. [10]), to measure in situ the actually generated k-space trajectory by means of a method according to Duyn et al. [11] in a previous experiment, and to subsequently perform pulse calculation on the basis of the experimentally determined k-space trajectory. In this fashion, the calculated RF pulses are already adjusted to deviations from the nominal k-space trajectory and can compensate for these to a certain degree. The actually passed k-space trajectory or the actually effective gradient pulses are thereby determined successively and separately for each gradient channel (single-channel measurement). Towards this end, the gradient pulse to be measured of one single gradient channel is applied while an MR signal from a slice positioned perpendicularly with respect to the respective field gradient direction at a separation d from the gradient system center, is simultaneously recorded. The experiment is subsequently repeated for a second slice at a separation -d, i.e. on the opposite side of the gradient system center, which is collectively called a two-slice measurement. The single-channel measurement is thereby necessary, since simultaneous application of gradient pulses with several gradient channels and with field gradient components parallel to the excited slice can cause the following problems: The effect of a gradient channel on a certain direction of movement in k-space and thereby separation of the individual k-space directions would be prevented or considerably aggravated, and also an additional, spatially and temporally varying phase of transverse magnetization would occur, which would falsify the subsequent phase-sensitive evaluation or render it impossible by dephasing the magnetization and thereby causing signal loss. The two-slice measurement is subsequently repeated for all gradient channels. When the individual slice positions are known, the k-space trajectory can subsequently be calculated from the phase development of the recorded MR signals, which developed under the influence of the gradient pulses. One great disadvantage of this method is, however, that, owing to the single-channel measurements, couplings of individual gradient coils, which can occur during simultaneous operation of all gradient channels, cannot be completely detected. One further disadvantage is the fact that influences of the above-mentioned unintentional non-linear additional magnetic fields can either not be detected or cannot be separated by the two-slice measurement and are then erroneously interpreted as influences by linear fields.

This is a central problem of the above-described methods. The above-mentioned methods cannot reconstruct components of additional magnetic fields, the spatial dependence of which contains higher orders than linear. Nor is it possible to consider such information in the methods for pulse calculation based on k-space trajectories. The k-space formalism is based on additional magnetic fields which have a linear spatial dependence, i.e. a field gradient that is constant in one spatial direction, and thereby a phase gradient of transverse magnetization, which is also constant in this spatial direction, and thereby generate a k-space trajectory that is globally valid for the overall object. This condition is not met by spatially non-linear magnetic fields, for which reason magnetic fields of this type, either intentional or unintentional, cannot be described in the form of a k-space trajectory and cannot be integrated in the previous pulse calculation methods. It should be noted that non-linear additional magnetic fields can occur not only in the form of unintentional components but also in the form of intentional components and be applied e.g. within the scope of the recently presented novel gradient concepts [12]. Such non-linear intentional fields can partly replace the formerly used linear gradient fields, whereby in case of selective excitation, a temporal spatially dependent, intentional phase development of transverse magnetization can be predetermined instead of the k-space trajectory.

The above-presented methods for determining and considering experimental imperfections in the RF pulse calculation, which show in the form of unintentional additional magnetic fields, are therefore not suited, in particular, when the unintentional additional magnetic fields to be compensated are spatially non-linear, or when previously intentional additional magnetic fields with non-linear dependence are required.

It is therefore the underlying purpose of the present invention to devise a method for obtaining amplitude and phase dependencies of RF pulses for single-channel or multi-channel selective excitation in a so-called main experiment, in which intentional and/or unintentional additional magnetic fields, which are applied simultaneously with the RF pulses, have spatial dependencies with non-linear components and/or temporally non-constant dependencies and in which, in particular, experimental imperfections in the form of unintentional additional magnetic fields are detected, taken into consideration, and compensated for.

SUMMARY OF THE INVENTION

This object is achieved by a method in accordance with the independent claim. Further variants and further advantageous properties and embodiments are described in the dependent claims.

The inventive method includes a preparational measurement prior to carrying out the main experiment. In the preparational measurement, the change with time of the transverse magnetization phase in the object is measured in a position-resolved fashion under the influence of additional magnetic fields which are used in the main experiment during selective excitation. The amplitude and phase dependencies of the radio frequency pulses for the main experiment are calculated on the basis of this change with time, measured in a position-resolved fashion, of the transverse magnetization phase.

For performing the main experiment, RF pulses with the amplitude and phase dependencies determined in this fashion are then irradiated into the object to be investigated. The spatial and temporal dependencies of the additional magnetic fields that are applied during selective excitation shall be substantially identical during the preparational measurement and the main experiment. This means that at least the controllable additional magnetic fields are selected to be the same for the preparational experiment and the main experiment. The calculated pulses are thereby adjusted to the magnetic fields that occur during the main experiment. Small deviations may occur and must be accepted within the scope of the technically and experimentally possible reproducibility.

The additional magnetic fields may consist of intentional and unintentional components, wherein it is not necessary for both components to be always present.

The inventive method is particularly advantageous when it is used for at least partial compensation of the effects of unintentional components of the additional magnetic fields on the transverse magnetization distribution generated in the main experiment. Unintentional components of this type can e.g. result from base field inhomogeneities, eddy current effects, susceptibility effects and imperfections of the gradient system.

In one variant of the inventive method, the intentional components of the additional magnetic fields have spatially constant gradients within the object and the time dependence of the gradient strength can be described by a k-space trajectory.

The method is particularly advantageous when the intentional components of the additional magnetic fields have spatially non-constant gradients within the object and the temporal and spatial dependence of the gradient strength can be described by a change with time of the transverse magnetization phase. This enables use of new encoding possibilities, faster switching times and/or stronger spatial gradients compared to conventional gradient fields.

The small tip angle approximation may be applied for calculating amplitude and phase dependencies of the radio frequency pulses. This results, however, in RF pulses which are only suited for small deflection angles.

In an alternative fashion, the small tip angle approximation cannot be applied for calculation of the amplitude and phase dependencies of the radio frequency pulses. Other approximation methods or iterative approaches must be used for calculating so-called large tip angle pulses than for the small tip angle approximation.

The inventive method is particularly advantageous when the object contains at least two nuclear spin ensembles with different precession frequencies, wherein each nuclear spin ensemble contributes to transverse magnetization, and when, for at least one of these contributions, an n-dimensional spatial distribution (n>=1) to be produced is required. The n-dimensional spatial distributions of the individual contributions to transverse magnetization may be identical or different from each other and together form the n-dimensional spatial distribution of transverse magnetization in the object.

In one variant, the phase development of the transverse magnetization is measured by only one spectral component of the object in the preparational measurement, whereby the bandwidth of the RF pulse that is used for excitation in frequency space should be selected such that only one spectral component of the object contributes to the MR signal. The inventive method therefore also determines RF pulses for spatially spectrally selective excitation.

In a particularly advantageous variant, the amplitude and phase dependencies of the radio frequency pulses are calculated in such a fashion that the radio frequency pulses can be irradiated with more than one radio frequency transmitting antenna in the main experiment to generate the predetermined transverse magnetization distribution. In addition to other advantageous effects, the duration of the radio frequency pulses and thereby the effective period of undesired interfering effects can be reduced and/or the excitation accuracy can be increased and/or the specific absorption rate can be reduced.

In a special variant, the measuring time of the preparational measurement can be reduced and/or its accuracy be increased by using more than one receiving antenna for the preparational measurement.

In another variant of the inventive method, data processing and pulse calculation can be simplified by measuring a quantity which depends on the phase evolution $\phi(x,t)$ and including this dependent quantity into the pulse calculation process without calculating the phase evolution explicitly.

In another advantageous variant, the development of the amplitude of the transverse magnetization is also measured in a position-resolved fashion during the preparational measurement, and one or more time constants of transverse relaxation are determined from the development of the amplitude, which is measured in a position-resolved fashion. These time constants can e.g. be taken into consideration in the subsequent pulse calculation, thereby compensating for relaxation effects that occur during the main experiment.

In a special variant the measurement of the phase evolution of the transverse magnetization in the object in a position-resolved fashion is performed by measuring the change with time of the transverse magnetization phase in at least one additional calibration object placed in the vicinity of the object and by generating a model for the change with time of the transverse magnetization phase at each position within the object based on the measured change with time of the transverse magnetization phase in this/these calibration object(s).

The amplitude and phase dependencies of the RF pulses are obtained in several partial steps in accordance with the inventive method.

In the first partial step, intentional additional magnetic fields are initially selected, which match the problem and enable transmission spatial encoding during the RF pulses applied for selective excitation.

In one variant of the inventive method, these intentional additional magnetic fields may be designed to have a linear spatial dependence as if generated by conventional gradient systems, and can be described by a k-space trajectory. The trajectory must thereby scan the k-space in all dimensions in which spatial modulation of transverse magnetization is to be effected with sufficient density and extension in order to detect an excitation area with desired extension and resolution. Within the scope of multi-channel excitation, a certain degree of undersampling may thereby be admissible, which has an upper limit due to the number of antenna array elements and the nature of their spatial transmission profiles.

In contrast thereto, in another variant, the intentional additional magnetic fields have a non-linear spatial dependence. These fields must also be selected to match the problem such that they generate a phase development of transverse magnetization that is suitable for selective excitation. In contrast to conventional gradient systems, new encoding possibilities, quicker switching times and/or stronger spatial gradients can be realized. As described above, the classical k-space formalism can no longer be applied in these cases. The inventive method is therefore particularly advantageous under these circumstances.

In a second step, all contributions to the phase development of transverse magnetization must be determined in a position-resolved fashion during a preparational measurement in situ. This preparational measurement includes an MR measurement.

In this connection one no longer assumes that the phase of transverse magnetization is only predetermined by intentional additional magnetic fields but additionally also by further terms resulting from unintentional additional magnetic fields. In case of linear intentional fields and a predetermined nominal k-space trajectory, the following terms may e.g. contribute to the phase development of transverse magnetization:

$$\varphi(x, t) = \sum_{i} x_i [k_i^{nom}(t + \tau_i) + \Delta k_i(t)] + \varphi_{\Delta G}(x, t) + \varphi_{\Delta B0}(x, t)$$

The summation variable i thereby stands for the three spatial directions (x, y, z), $\tau$ represents a time shift of the gradient pulses applied via the respective gradient channel, $\Delta k_i$ is a deviation from the nominal k-space trajectory based on a spatially linear separable deviation of the gradient field amplitude, $\phi_{\Delta G}$ describes phase contributions from non-linearly separable deviations of the gradient field amplitudes and $\phi_{\Delta B0}$ describes those from spatial base field inhomogeneities.

The result of this preparational measurement is a dataset of the phase development of the transverse magnetization $\phi(x,t)$ measured in a position-resolved fashion which contains the overall effects of intentional and unintentional additional magnetic fields. These can be measured e.g. with the method of Papadakis et al. [13].

This preparational measurement can be optimized with respect to the measuring time required for data recording by using more than one receiving antenna for detection. In this case, it is often possible to also use the transmitting antennas, which are used for parallel transmission, as receiving antennas for reception. Receiving and reconstruction technologies from parallel imaging thereby allow time-saving reduction of the required spatial encoding steps with gradient pulses and their partial replacement by sensitivity encoding.

A further possibility for measuring the change with time of the transverse magnetization phase in the object under investigation in a position-resolved fashion is to determine the change with time of the transverse magnetization phase in at least one additional calibration object placed in the vicinity of the object and to generate a model for the change with time of the transverse magnetization phase $\phi(x,t)$ at each position within the object under investigation based on the measured change with time of the transverse magnetization phase in this/these calibration object(s). Here it is essential that the inventive method is capable to base the pulse calculation on models $\phi(x,t)$ with an arbitrary spatial dependency which is particularly advantageous when the intentional components of the additional magnetic fields have spatially non-constant gradients within the object.

In the third step, the amplitude and phase dependencies of the RF pulses that are suitable for compensation of the undesired additional magnetic fields and for selective excitation are finally calculated on the basis of the phase development determined in a position-resolved fashion in the preparational measurement.

The calculation can be based on equation (1) which can be solved or approximated e.g. by means of an extension or generalization of the method of Grissom, as shown below:

Equation (1) gives the distribution of transverse magnetization in the small tip angle approximation. Differing from the conventional calculation methods, the phase term $\phi(x,t)$ is maintained in its universality in the inventive method without defining it via a k-space trajectory and without thereby limiting it to effects of linear additional magnetic fields, which can be described in the k-space formalism. The values determined in the preparational measurement are rather directly used for the variable $\phi(x,t)$.

The RF pulses $B_{1,n}(t)$ (n=1 . . . N) for the N-channel selective excitation of a predetermined transverse magnetization distribution M(x) can subsequently be determined analogously to the method of Grissom et al. by using the small tip angle approximation:

Equation (1) can be rendered discrete in space (index u) and time (index v) and expressed as a matrix equation:

$$M = AB$$

with $$M_u = M(x_u); \; B_{n,v} = B_{1,n}(t_v); \; A_u(n,v) = i\gamma M_0 S_n(x_u) e^{i\phi(x_u, t_v)} \Delta t \quad (2)$$

A spatially desired transverse magnetization distribution to be excited is thereby predetermined for $M_u$, measured or calculated transmission profiles of the antenna array elements used for excitation are used for $Sn(x_u)$, and the data of the spatial phase development determined in the preparational measurement is used for $\phi(x_u, t_v)$. RF pulses $B_{1,n}(t_v)$, which optimally match the actual phase development can finally be calculated by solving or approximating equation (2), e.g. using a minimizing approach with Tikhonov regularization (see [9]).

The RF pulses are calculated assuming that, during later application of the RF pulses, the conditions with respect to the additional magnetic fields within the scope of experimental reproducibility are identical to those generated in the preparational measurement by the additional magnetic fields to be measured. Since this can be substantially assumed, the calculated pulses are adjusted to the occurring magnetic fields such that the desired transverse magnetization distribution can be obtained with high accuracy despite any experimental imperfections that might occur during the main experiment.

The described calculation method can be used to determine RF pulses for single-channel excitation and also to determine RF pulses for multi-channel parallel excitation. For the latter case, equation (1) already contains the summation over N transmitting antennas with which coordinated RF pulses can be calculated after insertion of the transmission profiles N, the RF pulses being irradiated in parallel into an object with their individual transmission profiles during selective excitation from different transmission antennas of a transmission antenna array. The possibilities of transmission spatial encoding or degrees of freedom, which are thereby additionally provided by the spatial variation of the transmission profiles, can advantageously already be used for calculation of the RF pulses such that the resulting RF pulses are optimized with respect to several criteria. Possible are i.a. reduced duration of the RF pulses with e.g. reduced effective period of off-resonance effects with consequently more accurate selective excitation as well as more exact approximation of the desired transverse magnetization distribution or reduction of the specific absorption rate. The inventive method is also suited for application of spatially spectrally selective excitation of objects that contain several nuclear spin ensembles, each having a different precession frequency. In this case, the phase development of transverse magnetization should be measured by only one spectral component of the object in the preparational measurement. This can be achieved e.g. by exciting only one spectral component with an RF pulse of small bandwidth in frequency space. The data obtained in this fashion can then also be used as spatially dependent phase development $\phi(x,t)$ in the calculation methods of spatially spectrally selective pulses (e.g. according to [4]), analogously to the above description.

Even when calculation of the RF pulses is represented herein as an example with reference to the calculation of small tip angle pulses, the inventive method can also be used for calculating large tip angle pulses, if the respective calculation methods are also based on a predetermined spatial phase development of transverse magnetization $\phi(x,t)$ for which the values determined in the preparational measurement are then analogously used. As example for calculation of large tip angle pulses, reference is made to the above-mentioned method of Xu et al. [7] in which, like in most calculation methods, the phase development of the transverse magnetization is included and is described using a k-space trajectory ($\phi(x,t)=xk(t)$). This term can be replaced by the phase development determined in the preparational measurement in accordance with the invention, and for this reason, calculation of large tip angle pulses can also be optimally adjusted to unintentional additional magnetic fields.

In the approach described above, the phase evolution $\phi(x,t)$ is determined by measuring the MR signal as complex signal values $S*e^{i\phi(x,t)}$ (S: signal amplitude) and subsequent unwrapping of the phase cp. For the calculation of the RF pulses, $\phi(x,t)$ is inserted again into the term $e^{i\phi(x,T)}$ in Eq. (1). E.g. in case of pulse calculation according to Eq. (1) in the small tip angle regime, the intermediate step of extracting and unwrapping $\phi(x,t)$ can be skipped and the measured term $e^{i\phi(x,t)}$ (divided by $e^{i\phi(x,T)}$ to achieve $\phi(x,T)=0$) can be used directly for pulse calculation.

In one variant of the inventive method, data processing and pulse calculating can therefore be simplified by measuring a quantity which depends on the phase evolution $\phi(x,t)$ and including this quantity into the pulse calculation process without calculating the phase evolution from the dependent quantity explicitly.

In one particularly advantageous variant of the method, time constants of transverse relaxation are also determined in the course of the preparational measurement. Towards this end, in addition to the spatial phase development of transverse magnetization, the local development of its amplitude is also determined from the dependence of the MR signal of the preparational measurement. This information, which may also be obtained, if required, from data points located before start or after termination of the controllable additional magnetic fields applied in the preparational measurement, determines in a position-resolved fashion time constants of the transverse relaxation of magnetization, which is normally modelled by means of an exponential dependence. These time constants, the determination of which requires no additional measuring experiment in the present case, can subsequently be used e.g. for different correction and optimization methods. One example thereof is the use of the time constants in combination with the method of Haas et al. [14], with which relaxation effects that occur during application of selective RF pulses are also included in the calculation of the RF pulses and are at least partially compensated for. Towards this end, the previously neglected relaxation is explicitly integrated through one exponential term, which contains the time constants of the transverse relaxation, in the Bloch equations, resulting in equation (1), and also correspondingly taken into consideration in the RF pulse calculation method.

The inventive method offers the great advantage that, in contrast to previously used methods, one single preparational measurement is sufficient in order to determine all relevant contributions with respect to the transverse magnetization phase. For this reason, a combination of results from different measurements is avoided, which would entail the danger of additional mistakes and inaccuracies. This method moreover enables application of the finally used gradient pulses during the preparational measurement without being limited to the separated and successive activation of individual gradient channels. The overall influence of the additional magnetic fields of any spatial dependencies on the phase development of the transverse magnetization can therefore be detected. This information can subsequently be fully integrated in the RF pulse calculation and be used for compensation of unintentional additional fields.

The determined RF pulses can finally be applied in the main experiment for selective excitation of an object together with additional magnetic fields.

The following embodiment explains the invention in more detail with reference to the enclosed drawing. The embodiment concerns determination of a two-dimensional spatially selective excitation pulse using the inventive method for compensating experimental imperfections with subsequent slice-selective 2D-MRI recording. The illustrated and described embodiments are not to be understood as exhaustive enumeration but have exemplary character for describing the invention.

BRIEF DESCRIPTION OF THE DRAWING

FIG. 5 shows a schematic view concerning the sequence of gradients and RF pulses during the preparational measurement to determine the spatial phase development of transverse magnetization;

FIG. 7 shows the amplitude and phase dependencies of the RF pulse associated with the first transmission channel for selective excitation and calculated in accordance with the inventive method on the basis of the data of the preparational measurement;

DESCRIPTION OF THE PREFERRED EMBODIMENT

Figure 1:
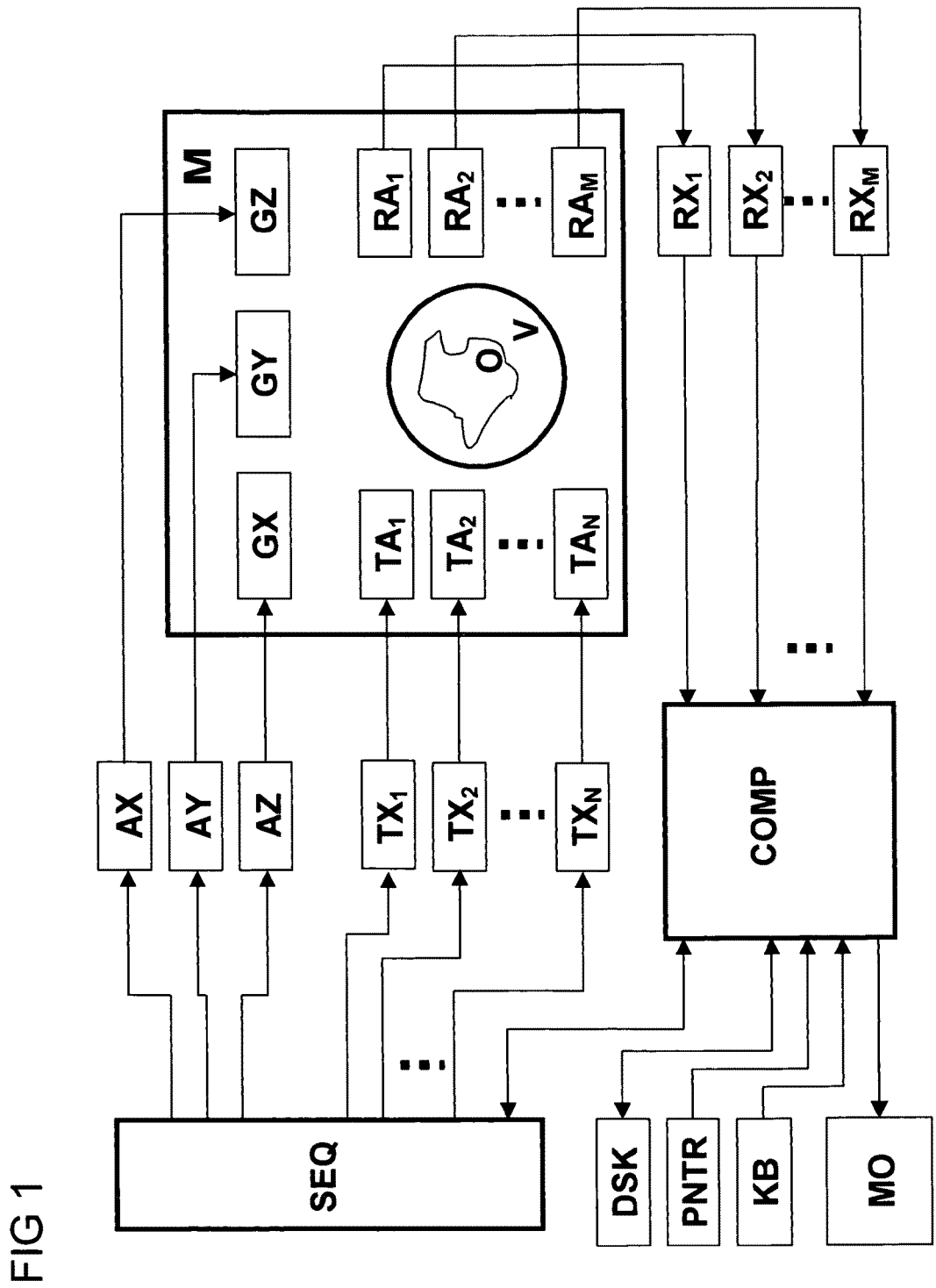
FIG. 1 shows a schematic view of an MRI system according to prior art, which is suitable to perform the inventive method.

FIG. 1 schematically shows an MR measuring system that is suited to perform the inventive method. The system contains a main magnet M which generates the basic magnetic field that is substantially homogeneous and static in a volume under investigation V. Three sets of gradient coils GX, GY and GZ are introduced into the bore of the main magnet M such that they surround this volume under investigation V, and can be used to superpose additional, temporally and spatially variable magnetic fields of a controllable duration and strength on the base field. The gradient coils GX, GY, GZ are supplied with electric current for generating gradient fields by means of gradient amplifiers AX, AY and AZ, which are driven by a sequence control unit SEQ for correctly timed generation of gradient pulses. The gradient coils that have been used up to now in routine applications normally generate linear magnetic fields with spatially constant gradients. Novel gradient concepts, however, also use gradients with non-linear dependence. This embodiment, however, is based on the normal linear gradient fields that can be described in the k-space formalism.

Figure 2:
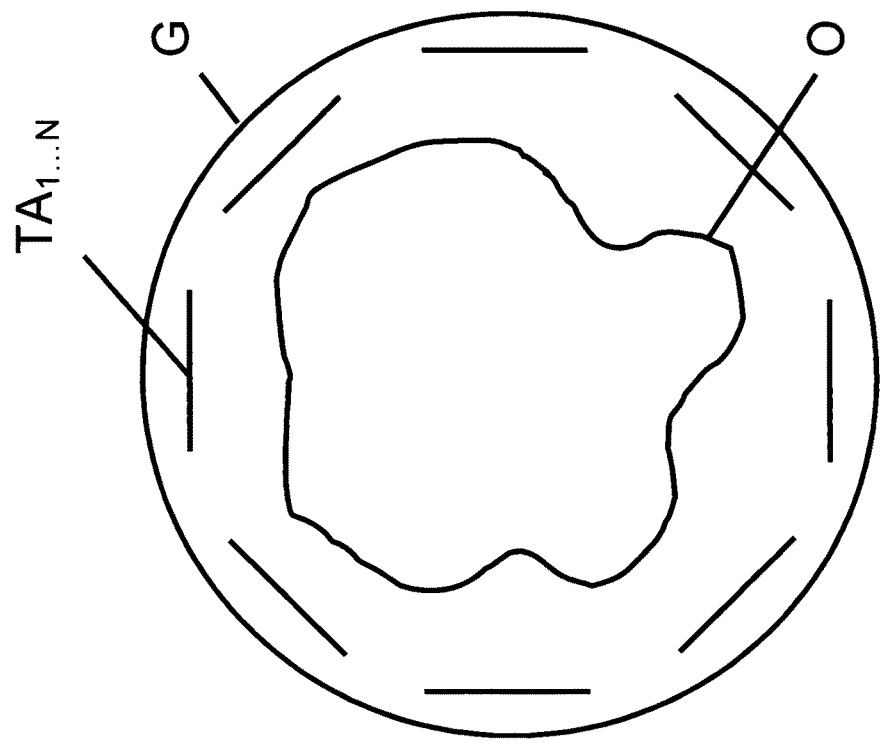
FIG. 2 shows a schematic view of an RF transmission antenna array according to prior art, which is suited to perform the inventive method.

Several (N) RF transmission antennas $TA_1$ to $TA_N$ are located within the gradient system, which, in their totality, are also called transmission antenna array. They surround an object under investigation 0 and are fed by several independent RF power transmitters $TX_1$ to $TX_N$. The RF pulses generated by these transmitters are determined and triggered at the correct time by the sequence control unit SEQ. The RF transmission antennas $TA_1$ to $TA_N$ irradiate RF pulses onto the object under investigation 0 located in the volume under investigation V and cause excitation of nuclear spins at that location. FIG. 2 shows an RF transmission antenna array that is suited for this purpose and has array elements which are disposed within one housing G. The magnetic resonance signals produced thereby are converted by one or more (M) RF receiving antennas $RA_1, \ldots RA_M$, which, in their entirety, are also called receiving antenna array, are also located within the gradient coils GX, GY, GZ, and surround the object under investigation 0, into electric voltage signals which are then fed into a corresponding number of receiving units $RX_1$ to $RX_M$. In order to reduce the instrumental expense, the antenna system can be designed and connected in such a fashion that one or more of the RF transmitting antennas $TA_1$ to $TA_N$ are also used to receive the magnetic resonance signals. In this case, which is not taken into consideration in FIG. 1, one or more electronic transmitting-receiving switches, which are controlled by the sequence control unit SEQ, ensure switching over between transmitting and receiving operation, i.e. this/these antenna(s) is/are connected to the corresponding RF power transmitter(s) during the RF transmission periods of the performed pulse sequence, and is/are separated from the associated receiving channel(s) while the receiving periods are disconnected from transmission and connected to the receiving channel. The receiving units $RX_1$ to $RX_M$ shown in FIG. 1 amplify the received signals, convert them into digital signals using conventional signal processing methods and pass them on to the electronic computer system COMP. In addition to reconstruction of images from the received measuring data, the control computer system COMP is used to operate the overall MR measuring system and initiate performance of the pulse sequences through corresponding communication with the sequence control unit SEQ. The user-controlled or automatic performance of programs for adjusting the measuring system properties and/or for generating magnetic resonance images is also performed on this control computer system COMP as well as the illustration of the reconstructed images and storage and administration of the measuring and image data and control programs. In order to perform these tasks, this computer system has at least one processor, one main storage, one computer keyboard KB, one display instrument PNTR, e.g. a computer mouse, one screen MO and one external digital storage unit DSK.

Figure 3:
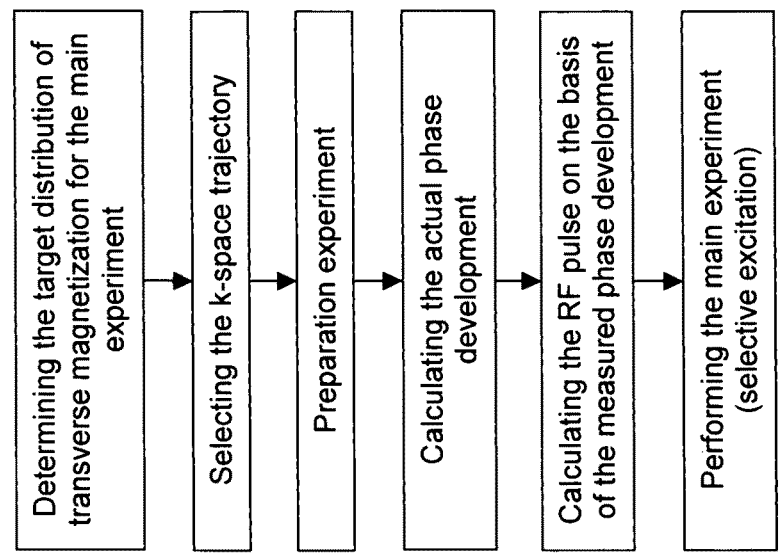
FIG. 3 shows a flow chart of one process variant of a preparational measurement, calculation step and selective excitation.
Figure 4B:
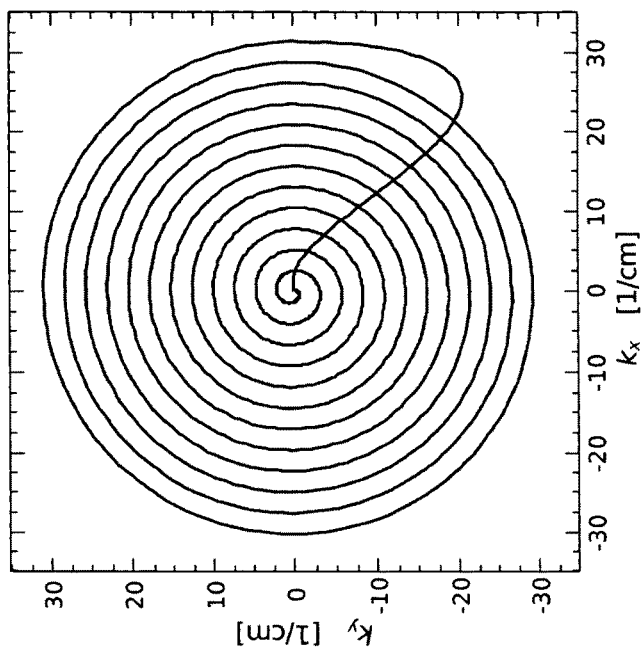
FIG. 4b shows a nominal k-space trajectory that is suited for the target distribution of FIG. 4a and is to be approximately passed during the RF pulse.
Figure 4A:
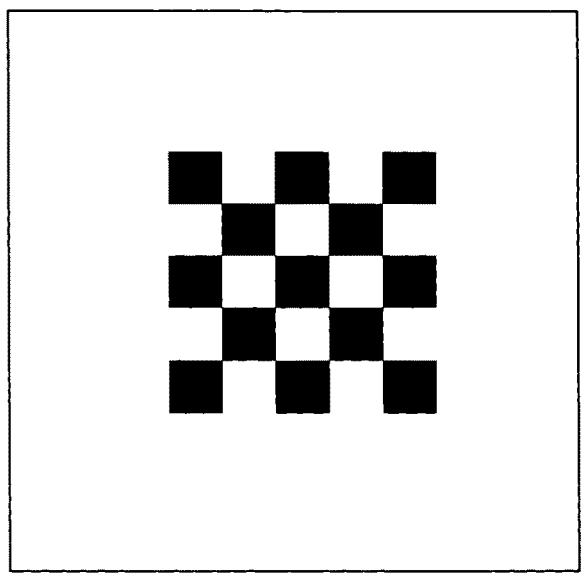
FIG. 4a shows one variant of the target distribution of the transverse magnetization.

FIG. 3 shows one variant of the measuring process. The measuring process initially starts by defining a target distribution of transverse magnetization, which is to be generated by one or several RF pulses within the scope of selective excitation. A checkered pattern is thereby used as example, as shown in FIG. 4a. A k-space trajectory that matches the problem is additionally selected. In the present example, the excitation shall be a two-dimensional spatially selective excitation and for this reason a spiral k-space trajectory is used as shown in FIG. 4b.

In the following preparational measurement, the effects of the intentional additional magnetic fields that are applied to realize this selected k-space trajectory, as well as all the effects of unintentional additional magnetic fields on the phase development of the transverse magnetization are determined. FIG. 5 shows, in a schematic and exemplary fashion, one process variant of such an experiment following the method of Papadakis et al. [13]. A conventional, slice-selective excitation pulse thereby generates transverse magnetization in the slice in which the selective excitation is to subsequently follow. The present example concerns an axial slice in the x-y plane in the center of the z-gradient. The signal from this slice is spatially encoded as is usual in imaging experiments (for data acquisition) by impressing a certain spatially dependent phase on the transverse magnetization through short-term application of gradient fields in the x and y direction (not to be confused with spatial encoding and phase development in case of transmission). Signal recording with at least one receiving antenna is subsequently started while the gradient fields to be measured are simultaneously applied in the x- and y direction for generating the k-space trajectory used for subsequent transmission. The experiment is e.g. repeated in total 64×64 times, wherein the phase steps used for spatial encoding of the acquired MR signal are varied by varying the gradient pulse amplitude until the data of one complete acquisition k-space are recorded.

It should thereby be ensured that the volumes combined into one image point during spatial encoding are sufficiently small and the bandwidths of the filters used for signal recording are sufficiently large to prevent signal depletion through dephasing of the magnetization or precession frequencies outside of the filter area.

When the preparational measurement is to be performed not only in one layer but in a three-dimensional volume, a global RF pulse that acts on the overall object is used instead of the slice-selective excitation pulse and additional gradients are switched for spatial encoding in the third direction (in the present case the z direction).

In the present example, the excitation in the preparational measurement was effected with an antenna array consisting of eight antennas, the individual transmission phases of which were selected such that the transmission fields are constructively superimposed in the antenna array center. As mentioned in the description of FIG. 1, the same antennas of the antenna array were used for reception.

For each receiving antenna, the dataset recorded in this fashion contains one to three (in the present case two) spatial dimensions and one dimension of time, along which the MR signal was recorded while the additional magnetic fields were effective. After decoding the spatial encoding performed prior to acquisition, which is generally realized by Fourier transformation of the dataset in the direction of the (acquisition-k-) spatial dimensions, the MR signals of the individual elements can be normalized and averaged to the respective phase of the first data point when several receiving antennas are used. The phase development with time is subsequently present for each image or spatial point, which is run through during the preparational measurement and also during the later selective application.

As described above, the required measuring time for recording the data in the preparational measurement can be considerably reduced by using several antennas for reception, and subsequently using parallel imaging reconstruction technologies.

Figure 6:
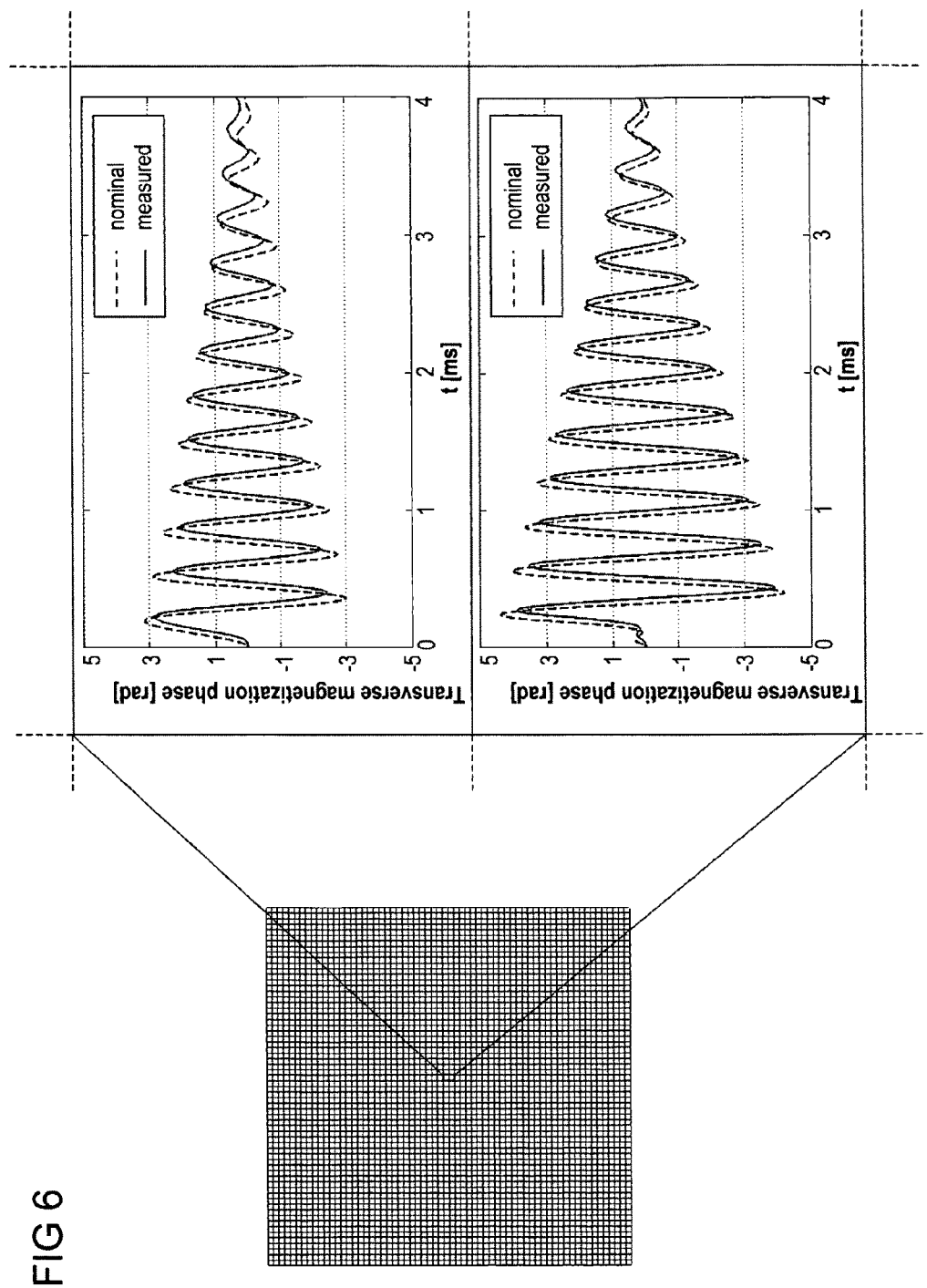
FIG. 6 shows a view of the phase development of the transverse magnetization (dashed line) expected with exact application of the nominal k-space trajectory, and of the phase development (full lines) that is actually measured in the preparational measurement on the x-y coordinates (1 mm/0 mm) and (1 mm/1 mm) with the zero point in the gradient center.

FIG. 6 shows examples of the measured phase dependencies at two positions with the x-y coordinates (1 mm/0 mm) and (1 mm/1 mm), with the point of origin being in the center of the gradient system. It shows calculated values which are expected assuming exact passage of the nominal k-space trajectory has taken place, and also actually measured values as a result of the preparational measurement. A discrepancy between the expected and measured values is clearly shown. RF pulses that are calculated on the basis of the nominal k-space trajectory would therefore not match the actually passed phase development, which generally produces artifacts and inaccuracies in the generated distribution of transverse magnetization.

For this reason, the phase developments for the variable $\phi(x,t)$, which were determined in the preparational measurement in a position-resolved fashion, are now inserted into equation (2) for pulse calculation. One can thereby assume that, in the experiment of selective excitation that is to be performed at a later time, the transverse magnetization evolves through the same phase development as during the preparational measurement. The calculation of RF pulses that excite the target distribution of transverse magnetization is finally started on this basis by solving or approximating the equation as described above, analogously to the method according to Grissom et al. [9]. In this example, one obtains eight RF pulses with individual amplitudes and phase dependencies, which are applied to the object during the experiment of selective excitation with eight transmission channels and antennas. The calculated amplitude and phase dependencies of the RF pulse which is allocated to the first transmission channel, are shown as examples in FIG. 7.

Figure 8C:
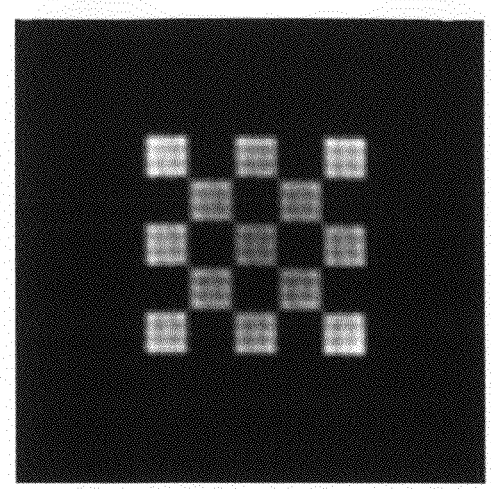
FIG. 8c shows the distribution, obtained in the main experiment, of the transverse magnetization in the object during application of RF pulses, which were calculated in accordance with the inventive method on the basis of the phase development determined in the preparational measurement.
Figure 8B:
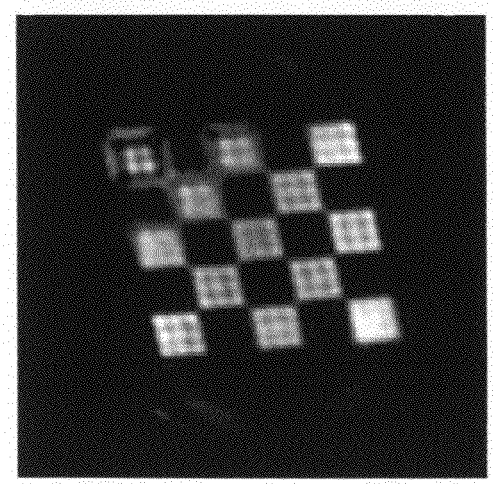
FIG. 8b shows the distribution, obtained in the main experiment, of the transverse magnetization in the object during application of RF pulses, which were calculated on the basis of the nominal k-space trajectory.
Figure 8A:
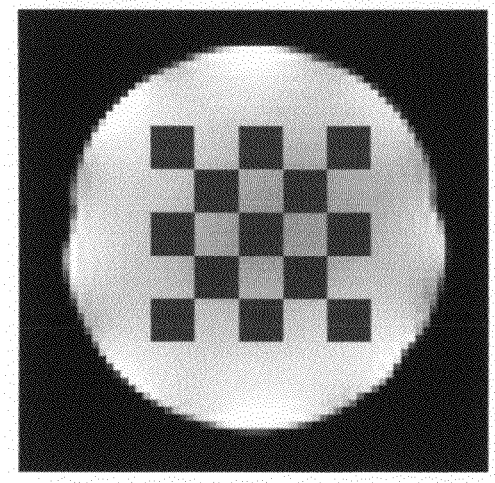
FIG. 8a shows an MR image of a plastic sphere, which is filled with water and used as the object to be excited, superimposed by the desired target distribution of the transverse magnetization.

The advantages of the inventive method are clearly presented in FIG. 8: FIG. 8*a* shows an MR image of a water-filled plastic sphere which is used as the object to be excited and superimposed by the desired target distribution of transverse magnetization. When only the nominal k-space trajectory is used during calculation of the RF pulses which are to excite the target distribution, and these RF pulses are subsequently applied in the main experiment while the deviations between expected and actual phase development of FIG. 6 are still present, the excitation is consequently disturbed as shown in FIG. 8*b*. The orientation and extension of the generated transverse magnetization distribution, its geometry and its sharpness clearly differ from the predetermined distribution.

Only when pulse calculation is performed in accordance with the inventive method on the basis of the measured spatial phase development are the deviations integrated in the RF pulse calculation and compensated for during excitation despite continued presence. The subsequent experiment of selective excitation yields very good correspondence between the excited and predetermined transverse magnetization distribution, as shown in FIG. 8*c*.

The inventive method therefore permits determination of RF pulses that are suited for single- or multi-channel selective excitation through position-resolved measurement of phase developments run through during the experiment, wherein experimental imperfections are taken into consideration and compensated for.

List of Reference Numerals

| | |
|---|---|
| A | array element |
| AX, AY, AZ | gradient amplifier |
| COMP | computer system |
| DSK | storage unit |
| G | housing |
| GX, GY, GZ | gradient coils |
| $G_x, G_y, G_z$ | gradient fields |
| KB | computer keyboard |
| M | main magnet |
| MO | screen |
| O | object under investigation |
| PNTR | display instrument |
| $RA_{1...M}$ | RF receiving antennas |
| $RX_{1...M}$ | receiving units |
| SEQ | sequence control unit |
| $TA_{1...N}$ | RF transmission antennas |
| $TX_{1...N}$ | RF power transmitter |
| V | volume under investigation |

REFERENCES

[1] Pauly, J.; Nishimura, D.; Macovski A.: A k-space analysis of small-tip-angle excitation. In: Journal of Magnetic Resonance 81 (1989), p. 43-56.

[2] Katscher U.; Bornert, P.; Leussler, C.; van den Brink, J. S.: Transmit SENSE. In: Magnetic Resonance in Medicine 49 (2003), p. 144-150.
[3] Meyer, C. H.; Pauly, J. M.; Macovski, A.; Nishimura, D. G.: Simultaneous spatial and spectral selective excitation. In: Magnetic Resonance in Medicine 15 (1990), p. 287-304.
[4] Setsompop, K.; Alagappan, V.; Gagoski, B.; Wald, L.; Adalsteinsson, E.: Uniform Wideband Slab Selection with B1+Mitigation at 7T via Parallel Spectral-Spatial Excitation. In: Proceedings 16th Scientific Meeting, International Society for Magnetic Resonance in Medicine (2008), 616.
[5] Schomberg, H.; Bornert, P.: Off-resonance correction of nD spatially selective RF pulses. In: Proceedings 6th Scientific Meeting, International Society for Magnetic Resonance in Medicine, Sydney, 1998, p. 2059.
[6] Börnert, P.; Aldefeld, B.: On spatially selective RF excitation and its analogy with spiral MR image acquisition. In: Magnetic Resonance Materials in Physics, Biology and Medicine 7 (1998), p. 166-178.
[7] Xu, D.; King, K. F.; Zhu, Y. D.; McKinnon, G. C.; Liang, Z. P.: A noniterative method to design large-tip-angle multidimensional spatially-selective radio frequency pulses for parallel transmission. In: Magnetic Resonance in Medicine 58 (2007), p. 326-334.
[8] Yip, C.-Y.; Fessler, J. A.; Noll, D. C.: Iterative RF pulse design for multidimensional, small-tip-angle selective excitation. In: Magnetic Resonance in Medicine 54 (2005), p. 908-917.
[9] Grissom, W.; Yip, C.-Y.; Zhang, Z.; Stenger, V. A.; Fessler, J. A.; Noll, D. C.: Spatial domain method for the design of RF pulses in multicoil parallel excitation. In: Magnetic Resonance in Medicine 56 (2006), p. 620-629.
[10] Ullmann, P.; Haas, M.; Hennel, F.; Wick, M.; Voiron, J.; Zaitsev, M.; Hennig, J.; Ruhm, W.: Parallel Excitation Experiments Using Measured k-Space Trajectories for Pulse Calculation. In: Proceedings 16th Scientific Meeting, International Society for Magnetic Resonance in Medicine (2008), 1313.
[11] Duyn, J. H.; Yang, Y.; Frank, J. A.; van der Veen, J. W.: Simple correction method for k-space trajectory deviations in MRI. In: Journal of Magnetic Resonance 132 (1998), p. 150-153.
[12] DE 10 2005 051 021 A1; Hennig, J.: Apparaturen and Verfahren zur kernspintomographischen Aufnahme mit lokalen Magnetfeldgradienten in Verbindung mit lokalen Empfangsspulen (Apparatuses and methods for nuclear magnetic resonance recording with local magnetic field gradients in connection with local receiving coils).
[13] Papadakis, N. G.; Wilkinson, A. A.; Carpenter T. A.; Hall, L. D.: A general method for measurement of the time integral of variant magnetic field gradients: application to 2D spiral imaging. In: Magnetic Resonance Imaging 15 (1997), p. 567-578.
[14] Haas, M.; Kokorin, D.; Ullmann, P.; Schneider, J. T.; Hennig, J.; Zaitsev, M.: T2*-compensated Transmit SENSE RF pulses. Accepted to be published in: Proceedings 17th Scientific Meeting, International Society for Magnetic Resonance in Medicine (2009), 2589.

We claim:

1. A method comprising:
obtaining an amplitude and phase behavior with time of radio frequency pulses, which are irradiated within a scope of a main magnetic resonance experiment for generating a predetermined n-dimensional spatial distribution of transverse magnetization within an object by means of at least one radio frequency transmitting antenna of a magnetic resonance measuring system in combination with spatially and temporally varying additional magnetic fields which are superimposed on a static and homogeneous basic field of the magnetic resonance measuring system and which change a transverse magnetization phase in the object in dependence on location and time, wherein n>=1, wherein the obtaining comprises:
a) performing, using the magnetic resonance measuring system, a preparational measurement in which a change with time of the transverse magnetization phase in the object under the exclusive action of the additional magnetic fields is measured in a position-resolved fashion, wherein measuring the change with time of the transverse magnetization phase comprises sampling a magnetic resonance signal during a time period in which the radio frequency pulses are to be applied;
b) calculating an amplitude and phase behavior with time of the radio frequency pulses for the main experiment using the measured change with time of the transverse magnetization phase of step a); and
performing the main experiment using the magnetic resonance measuring system to transmit the radio frequency pulses calculated in step b).

2. The method of claim 1, wherein the additional magnetic fields consist of intentional and unintentional components, the method being used for at least partial compensation of effects of unintentional components of the additional magnetic fields on the transverse magnetization distribution generated in the main experiment.

3. The method of claim 2, wherein intentional components of the additional magnetic fields have spatially constant gradients within the object.

4. The method of claim 1, wherein the additional magnetic fields consist of intentional and unintentional components, the intentional components of the additional magnetic fields having spatially non-constant gradients within the object.

5. The method of claim 4, wherein effects of unintentional components of the additional magnetic fields on the transverse magnetization distribution generated in the main experiment are at least partially compensated.

6. The method of claim 1, wherein a small tip angle approximation is applied for calculating the amplitude and phase behavior with time of the radio frequency pulses.

7. The method of claim 1, wherein a small tip angle approximation is not applied for calculating the amplitude and phase behavior with time of the radio frequency pulses.

8. The method of claim 1, wherein the object contains at least two nuclear spin ensembles with different precession frequencies, with each nuclear spin ensemble contributing to the transverse magnetization, wherein an n-dimensional spatial distribution (n>=1) to be produced is predetermined for at least one of these contributions.

9. The method of claim 8, wherein the change with time of the transverse magnetization phase is measured in the preparational measurement for only one spectral component of the object.

10. The method of claim 1, wherein calculation of the amplitude and phase behavior with time of the radio frequency pulses is performed in such a fashion that the radio frequency pulses for generating the predetermined transverse magnetization distribution can be irradiated in the main experiment using more than one radio frequency transmitting antenna.

11. The method of claim 1, wherein more than one receiving antenna is used in the preparational measurement.

12. The method of claim 1, wherein the preparational measurement of the change with time of the transverse magnetization phase is performed indirectly by measurement of a quantity which depends on this change, wherein this quantity is used during the calculation of the amplitude and phase behavior with time of the radio frequency pulses as a term dependent on the change with time of the transverse magnetization phase.

13. The method of claim 1, wherein one or more time constants of transverse relaxation are also obtained in the preparational measurement in a position-resolved fashion.

14. The method of claim 1, wherein the measurement of the change with time of the transverse magnetization phase in the object in a position-resolved fashion is performed by measuring the change with time of the transverse magnetization phase in at least one additional calibration object placed in a vicinity of the object and by generating a model for the change with time of the transverse magnetization phase at each position within the object based on the measured change with time of the transverse magnetization phase in the calibration object.

15. The method of claim 2, wherein the additional magnetic fields consist of intentional and unintentional components, the intentional components of the additional magnetic fields having spatially non-constant gradients within the object.

16. The method of claim 2, wherein calculation of the amplitude and phase behavior with time of the radio frequency pulses is performed in such a fashion that the radio frequency pulses for generating the predetermined transverse magnetization distribution can be irradiated in the main experiment using more than one radio frequency transmitting antenna.

17. The method of claim 4, wherein calculation of the amplitude and phase behavior with time of the radio frequency pulses is performed in such a fashion that the radio frequency pulses for generating the predetermined transverse magnetization distribution can be irradiated in the main experiment using more than one radio frequency transmitting antenna.

18. The method of claim 2, wherein more than one receiving antenna is used in the preparational measurement.

19. The method of claim 4, wherein more than one receiving antenna is used in the preparational measurement.

20. The method of claim 2, wherein the measurement of the change with time of the transverse magnetization phase in the object in a position-resolved fashion is performed by measuring the change with time of the transverse magnetization phase in at least one additional calibration object placed in a vicinity of the object and by generating a model for the change with time of the transverse magnetization phase at each position within the object based on the measured change with time of the transverse magnetization phase in the calibration object.

21. The method of claim 4, wherein the measurement of the change with time of the transverse magnetization phase in the object in a position-resolved fashion is performed by measuring the change with time of the transverse magnetization phase in at least one additional calibration object placed in a vicinity of the object and by generating a model for the change with time of the transverse magnetization phase at each position within the object based on the measured change with time of the transverse magnetization phase in the calibration object.

* * * * *